(12) United States Patent
Ikeda et al.

(10) Patent No.: US 10,051,755 B2
(45) Date of Patent: Aug. 14, 2018

(54) WATERPROOF STRUCTURE FOR ELECTRONIC COMPONENT HOUSING UNIT

(71) Applicant: YAZAKI CORPORATION, Minato-ku, Tokyo (JP)

(72) Inventors: Tomohiro Ikeda, Shizuoka (JP); Koji Koizumi, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 325 days.

(21) Appl. No.: 14/920,433

(22) Filed: Oct. 22, 2015

(65) Prior Publication Data

US 2016/0050784 A1 Feb. 18, 2016

Related U.S. Application Data

(63) Continuation of application No. PCT/JP2014/060944, filed on Apr. 17, 2014.

(30) Foreign Application Priority Data

Apr. 26, 2013 (JP) .................. 2013-094281
Oct. 8, 2013 (JP) .................. 2013-210835

(51) Int. Cl.
*H05K 5/06* (2006.01)
*H05K 5/00* (2006.01)
*H02G 3/08* (2006.01)

(52) U.S. Cl.
CPC .......... *H05K 5/069* (2013.01); *H05K 5/0056* (2013.01); *B60L 2270/145* (2013.01); *H02G 3/088* (2013.01)

(58) Field of Classification Search
CPC ........ H05K 5/069; H05K 5/0056; H05K 5/06; H05K 5/0095; H05K 5/00; H05K 5/065; H05K 5/064; H05K 5/0204; H02G 3/088
(Continued)

(56) References Cited

U.S. PATENT DOCUMENTS 3,952,142 A * 4/1976 Weiss ................ H05K 5/06
174/551
5,663,525 A * 9/1997 Newman ............ H02B 1/305
174/50

(Continued)

FOREIGN PATENT DOCUMENTS

JP 2007-288908 A 11/2007
JP 2009-213195 A 9/2009

*Primary Examiner* — Robert Poon
(74) *Attorney, Agent, or Firm* — Metrolexis Law Group, PLLC

(57) ABSTRACT

A waterproof structure for an electronic component housing unit provided with a connection unit on the upper side in the vertical direction of a vehicle, to which the terminal of an electric wire is connected, includes a top cover. The top cover is provided with a bottom opening portion opening to the lower end and covers the electronic component housing unit from the upper side in the vertical direction of the vehicle while forming a space between the top side of the electronic component housing unit in the vertical direction of the vehicle and the top cover, in which the terminal of the electric wire connected to the connection unit is housed. The electric wire led out from the terminal connected to the connection unit is led out from the bottom opening portion of the top cover.

9 Claims, 15 Drawing Sheets

(58) Field of Classification Search
USPC .................................................. 220/3.8, 3.2
See application file for complete search history.

(56) References Cited

U.S. PATENT DOCUMENTS

| | | | | | |
|---|---|---|---|---|---|
| 5,731,545 | A | * | 3/1998 | Reed | H02G 3/088 174/66 |
| 5,922,990 | A | * | 7/1999 | Alaerts | H01R 13/5208 174/17 CT |
| 6,184,461 | B1 | * | 2/2001 | Flegel | H01R 13/72 174/135 |
| 2002/0191365 | A1 | * | 12/2002 | Byler | H05K 5/0095 361/301.3 |
| 2004/0196636 | A1 | * | 10/2004 | Kim | F21K 9/00 361/736 |
| 2008/0304200 | A1 | * | 12/2008 | Hotchkiss | B29C 39/00 361/111 |
| 2009/0101382 | A1 | * | 4/2009 | Arlotta | G02B 6/4441 174/50 |
| 2009/0221160 | A1 | | 9/2009 | Taniguchi et al. | |
| 2009/0302034 | A1 | * | 12/2009 | Makela | H02G 3/0658 220/3.8 |
| 2011/0226526 | A1 | * | 9/2011 | Chu | H02G 3/088 174/659 |
| 2013/0240234 | A1 | | 9/2013 | Roche et al. | |
| 2014/0374412 | A1 | * | 12/2014 | Rumsey | H02G 3/08 220/3.8 |

* cited by examiner

WATERPROOF STRUCTURE FOR ELECTRONIC COMPONENT HOUSING UNIT

CROSS REFERENCE TO RELATED APPLICATIONS

This application is a continuation of International Application No. PCT/JP2014/060944, filed Apr. 17, 2014, and based upon and claims the benefit of priority from Japanese Patent Applications No. 2013-094281, filed Apr. 26, 2013, and No. 2013-210835, filed Oct. 8, 2013, the entire contents of all of which are incorporated herein by reference.

TECHNICAL FIELD

The present invention relates to a waterproof structure for an electronic component housing unit in which a substrate or the like is housed.

BACKGROUND ART

A power supply unit, which is mounted on an electric vehicle, a hybrid vehicle, or the like to supply an electric motor with electricity, is provided by vertically and horizontally arranging a plurality of cell battery assemblies (cell modules), in which a plurality of unit cell batteries are laminated in parallel and also connected to each other in series, and further connecting these assemblies in series. Also, voltage detection wires for detecting voltages of the plurality of unit cell batteries individually are led out from the power supply unit and further connected to an electronic component housing unit (ECU, electrical connection box). Thus, the ECU is adapted so as to detect the voltages of the unit cell batteries and further control the voltage of the power supply unit. The connection of the voltage detection wires to the ECU is accomplished by connecting a connector to respective terminals of the voltage detection wires and subsequently fitting the connector to a mating connector portion provided in the ECU.

Meanwhile, when a vehicle is submerged due to a heavy rain, a flood, or the like, there is a risk that in-vehicle components could be also immersed in water. Particularly, if such an ECU to which the voltage detection wires led out from the power supply unit is submerged, the connector connecting the voltage detection wires to the ECU may be also submerged. Although the incursion of water into the ECU is blocked by a sealed case, there is a risk that water could intrude into the case through the connector.

Therefore, it would be envisaged to construct the connector connecting the voltage detection wires with the ECU as a waterproof connector having a waterproofing property. However, as the waterproof connector requires a waterproof rubber plug, a packing, and the like, the number of components is increased, and furthermore, the manufacturing cost is elevated because a mating connector part on the side of the ECU has to be constructed with a water proof property.

JP 2007-288908 A (PTL 1) proposes a structure where the electrical connection box (ECU) is covered, from the top side in the vehicular vertical direction, with a cover that rise of a water level up to a connecting part of the connector in submergence is prevented by the action of air pressure of a space inside the cover. In this conventional example, as the connecting part with terminals of wires is positioned on the bottom side of the electrical connection box, the structure is adapted so that even if a vehicle submerges, water level would not rise up to the bottom side of the electrical connection box due to air pressure inside the cover. Consequently, even when the electrical connection box is submerged, electronic components are adapted so as to be protected against water.

SUMMARY

Nevertheless, as the surface of water in submergence is on the bottom side of the electrical connection box in the structure of PTL 1, there is a risk that the connecting part between the electrical connection box and the wires is submerged if the surface of water is inclined due to vehicle's slanting, vibration, or the like, or water splash is caused by water dripping or the like.

Therefore, an object of the present invention is to provide, without using a waterproof connector in the connection between an electronic component housing unit, such as an electric connection box, and a terminal of a wire, a waterproof structure for electronic component housing unit, in which a connection unit having the wire's terminal connected thereto couldn't be submerged even when an ambient water level rises so that the electronic component housing unit goes under the water.

According to a first aspect of the present invention, there is provided a waterproof structure for an electronic component housing unit mounted on a vehicle and provided, on a top side thereof in a vehicular vertical direction, with a connection unit to which a terminal of an electric wire is connected, the waterproof structure including a top cover provided with a bottom opening portion opening at a lower end of the top cover and adapted so as to cover the electronic component housing unit from the upper side in the vehicular vertical direction while forming a space between the top side of the electronic component housing unit in the vehicular vertical direction and the top cover, in which the terminal of the electric wire connected to the connection unit is housed. The electric wire led out from the terminal connected to the connection unit is led out from the bottom opening portion of the top cover.

Since the connection unit to which the terminal of the electric wire is connected is covered, on the top side of the electronic component housing unit in the vehicular vertical direction, with the top cover from upside, there is no possibility that water enters the connecting part, for example, even if the electronic component housing unit is submerged, owing to the air pressure in the space defined between the top side of the electronic component housing unit and the top cover. Thus, there is no possibility for the terminal of the electric wire and the connection unit to be submerged.

Additionally, with this possibility of preventing submergence, there is no need of providing a waterproof connector structure in the connection between the terminal of the electric wire and the connection unit.

The top cover may include a top wall part opposed to a top wall of the electronic component housing unit on the top side in the vehicular vertical direction to cover the top wall, a peripheral sidewall part opposed to respective sidewalls of the electronic component housing unit to cover the sidewalls, the bottom opening portion into which the electronic component housing unit is inserted, and a locking member locked to the electronic component housing unit while the top cover is covering the electronic component housing unit. Then, since the top cover includes: the top wall part opposed to the top wall of the electronic component housing unit on the top side in the vehicular vertical direction to cover the top wall; the peripheral sidewall part opposed to respective sidewalls of the electronic component housing unit to cover the sidewalls; and the bottom opening portion into which the electronic component housing unit is inserted, there is provided a sealing structure excluding the possibility of air leakage. For this reason, there is no possibility that air leaks out through a space between the connection unit of the electronic component housing unit and the top cover.

Moreover, as the top cover includes the locking member to be locked to the electronic component housing unit while covering the electronic component housing unit, there is defined a space between the connection unit on the electronic component housing unit and the top wall part of the top cover, so that entry of water can be prevented by air pressure in the space. Further, as the locking member prevents the top cover from floating off, the space could be reliably maintained even if an ambient water level rises so that the electronic component housing unit goes under the water.

In order to guide the electric wire, which has been led out from the terminal connected to the connection unit, to the bottom opening portion of the top cover, the waterproof structure may further include a wire guide member disposed between the electronic component housing unit and the top cover.

By providing the wire guide member for guiding the electric wire to the bottom opening portion of the top cover between the electronic component housing unit and the top cover, the routing of the wire in relation to the top cover can be stabilized.

Additionally, since the occurrence of a situation where the electric wire is going to get damaged by its contact with the top cover can be prevented by the wire guide member, it is possible to prevent an occurrence of disconnection or short circuit derived from vibrations during vehicle travelling, certainly.

The top cover may be provided with a plurality of ribs which project toward the electronic component housing unit and also extend from the top side in the vehicular vertical direction up to the bottom opening portion.

By providing the top cover with the plurality of ribs projecting toward the electronic component housing unit and also extending from the top side in the vehicular vertical direction up to the bottom opening portion, the amount of air in the top cover can be increased. For this reason, even if an ambient water level rises so that the electronic component housing unit goes under the water, it is possible to prevent the surface of water from rising owing to the large amount of air between the top cover and the electronic component housing unit and also possible to prevent the water from reaching the top side of the electronic component housing unit. Additionally, it is possible to prevent the connection unit above the electronic component housing unit and the terminal of the electric wire connected to the connection unit from being submerged.

According to a second aspect of the present invention, there is also provided a waterproof structure for an electronic component housing unit mounted on a vehicle and provided with a connection unit to which a terminal of an electric wire is connected, the waterproof structure including: a bottom cover provided with a top opening portion opening at an upper end of the bottom cover and adapted so as to cover the electronic component housing unit from the lower side in the vehicular vertical direction; and a top cover provided with a bottom opening portion opening at a lower end of the top cover and adapted so as to cover the electronic component housing unit from the upper side in the vehicular vertical direction while forming a space in which the terminal of the electric wire connected to the connection unit of the electronic component housing unit is housed. The electric wire led out from the terminal connected to the connection unit passes through between the electronic component housing unit and the bottom cover and between the top cover and the bottom cover, and is led out from the bottom opening portion of the top cover.

Thus, the bottom cover covers the electronic component housing unit from the lower side in the vehicular vertical direction, while the top cover covers the electronic component housing unit from the upper side in the vehicular vertical direction while forming the space and additionally, the electric wire led out from the terminal connected to the connection unit passes through: between the electronic component housing unit; the bottom cover; and between the top cover and the bottom cover and subsequently, the wire is led out from the bottom opening portion of the top cover. Therefore, even if the electronic component housing unit is submerged, there is no possibility that water enters the connecting part, owing to the air pressure in the space defined between the top side of the electronic component housing unit and the top cover. Thus, there is no possibility for the terminal of the electric wire and the connection unit to be submerged. Additionally, with this possibility of preventing submergence, there is no need of providing a waterproof connector structure in the connection between the terminal of the electric wire and the connection unit.

The electronic component housing unit may be composed of a substrate or composed of a combination of a substrate and a substrate case in which the substrate is housed.

By constructing the electronic component housing unit by the substrate only, the electronic component housing unit becomes reduced in size and correspondingly, it is possible to miniaturize the top cover and the bottom cover and also possible to make the installation space for the electronic component housing unit smaller. In this case, owing to the provision of the bottom cover, the waterproofing of the substrate is accomplished even without a substrate case.

By constructing the electronic component housing unit so as to accommodate the substrate in the substrate case, meanwhile, electronic components on the substrate are covered with the substrate case. Thus, the electronic components are protected when installing the electronic component housing unit inside the top cover and the bottom cover, so that the installation work of the electronic component housing unit to the top cover and the bottom cover can be facilitated.

The bottom cover may be provided with a plurality of ribs which project toward the electronic component housing unit and also extend from a bottom side thereof in the vehicular vertical direction up to the top opening portion.

By providing the bottom cover with the plurality of ribs, the rigidity of the bottom cover can be enhanced to allow the substrate to be retained firmly and simultaneously, it becomes possible to guide the electric wire with use of the ribs, so that the routing of the wire can be facilitated.

In the waterproof structure according to the first or second aspect of the present invention, it may further include a wire guide member disposed: at least one of: between the electronic component housing unit and the top cover; and between the top cover and the bottom cover, in order to guide the electric wire, which has been led out from the terminal connected to the connection unit, to the bottom opening portion of the top cover.

By arranging the wire guide member for guiding the electric wire to the bottom opening portion of the top cover: at least one of: between the electronic component housing unit and the top cover; and between the top cover and the bottom cover, the routing of the wire in relation to the top cover can be stabilized.

Additionally, since the occurrence of a situation where the electric wire is going to get damaged by its contact with the top cover can be prevented by the wire guide member, it is possible to prevent an occurrence of disconnection or short circuit derived from vibrations during vehicle travelling, certainly.

The top cover may be provided with a plurality of ribs which project toward the electronic component housing unit and also extend from the top side in the vehicular vertical direction up to the bottom opening portion.

By providing the top cover with the plurality of ribs projecting toward the electronic component housing unit and also extending from the top side in the vehicular vertical direction up to the bottom opening portion, the amount of air in the top cover can be increased. For this reason, even if an ambient water level rises so that the electronic component housing unit goes under the water, it is possible to prevent the surface of water from rising owing to the large amount of air between the top cover and the electronic component housing unit and also possible to prevent the water from reaching the top side of the electronic component housing unit. Additionally, it is possible to prevent the connection unit above the electronic component housing unit and the terminal of the electric wire connected to the connection unit from being submerged.

DESCRIPTION OF EMBODIMENTS

Embodiments of the present invention will be described with reference to drawings.

First Embodiment

FIGS. 1 to 5 illustrate a waterproof structure 1 for electronic component housing unit (which will be simply referred to as "waterproof structure" hereinafter) according to the first embodiment.

Figure 1:
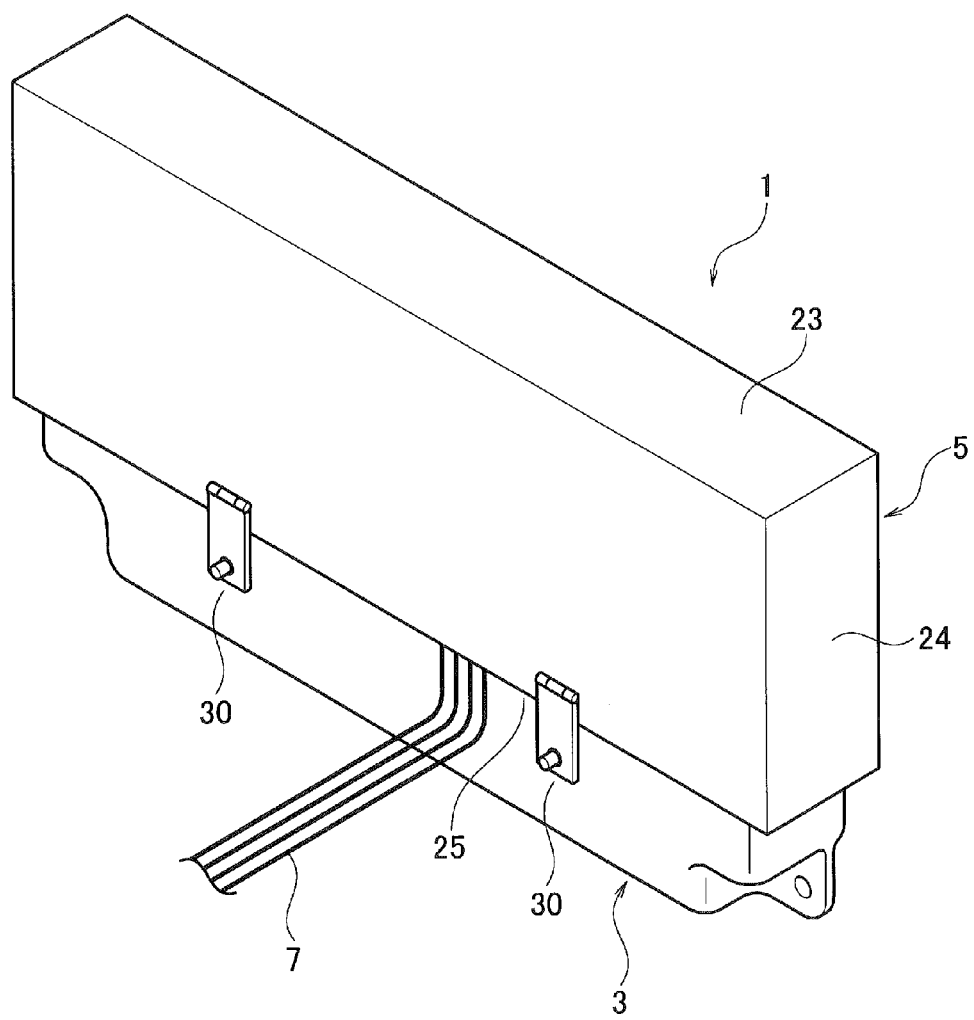
FIG. 1 is a general perspective view illustrating a waterproof structure according to a first embodiment.
Figure 2:
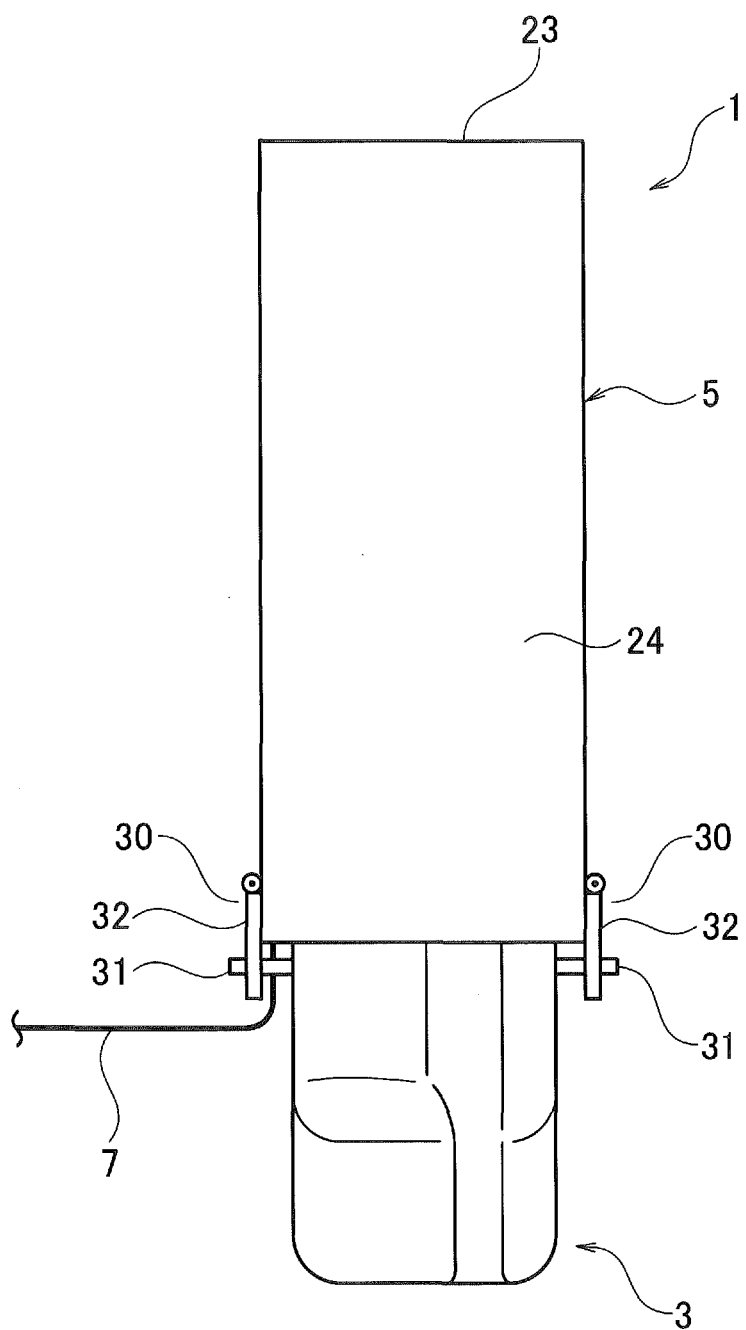
FIG. 2 is a general side view illustrating the waterproof structure according to the first embodiment.

As illustrated in FIGS. 1 and 2, the waterproof structure 1 according to the first embodiment includes an electronic component housing unit 3 for an electronic component, such as an ECU, and a top cover (top cover composed of e.g. insulating synthetic resin) 5 covering the electronic component housing unit 3.

Figure 3:
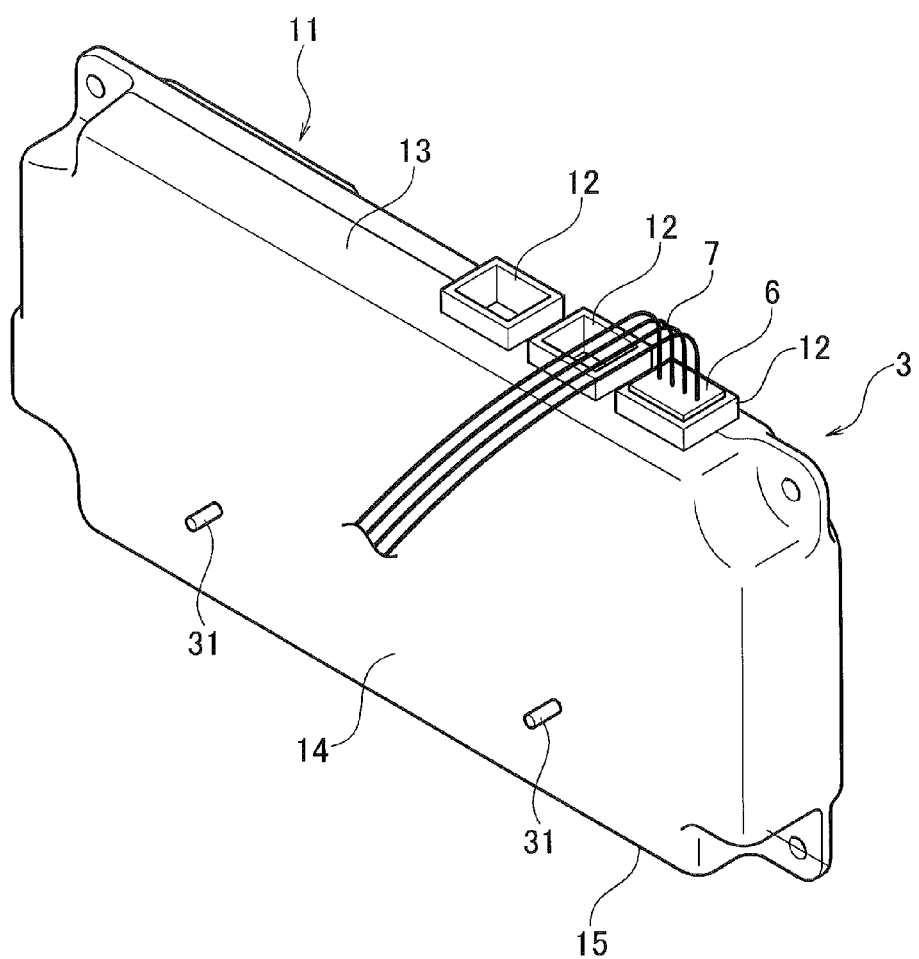
FIG. 3 is a general perspective view of an electronic component housing unit according to the first embodiment.
Figure 4:
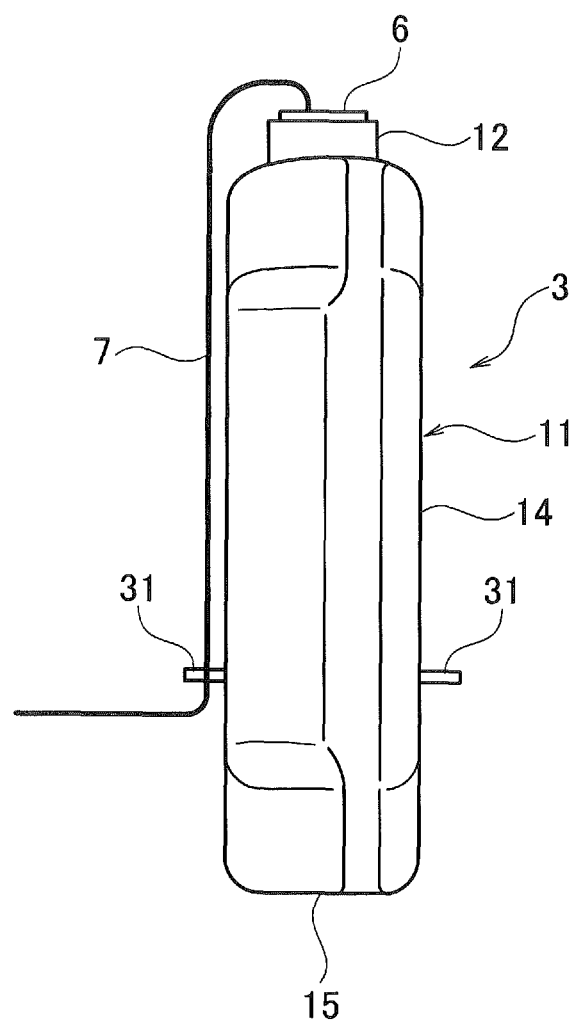
FIG. 4 is a general side view of the electronic component housing unit according to the first embodiment.

The electronic component housing unit 3 is adapted so as to house an electronic component (not illustrated) mounted on a substrate or the like, and includes, as illustrated in FIGS. 3 and 4, a box-shaped unit body (unit body composed of e.g. insulating synthetic resin) 11 and connection units 12 provided in the unit body 11.

The unit body 11 is formed with a box-shaped profile composed of a top wall 13, a bottom wall 15, and four circumferential sidewalls 14 between the top wall 13 and the bottom wall 15. In the unit body 11, respective peripheral portions of the top wall 13, the bottom wall 15, and the sidewalls 14 are closely kept into contact with each other by means of packing (not illustrated) or the like. Thus, the whole unit body 11 but the connection units 12 is brought into a tightly closed condition and therefore, the electronic component is housed inside this tightly closed condition.

As illustrated in FIGS. 3 and 4, the electronic component housing unit 3 is mounted on a vehicle in a vertical state where the top wall 13 of the unit body 11 is arranged on the top side in a vehicular vertical direction (i.e. vertical direction in the drawing; the same applies hereafter) while the bottom wall 15 is arranged on the bottom side in the vehicular vertical direction. Additionally, in the vertical direction, the electronic component housing unit 3 is positioned on the upper side of a power unit (not illustrated) composed of a cell module.

On the top side of the electronic component housing unit 3 (for example, at the top end and furthermore, projecting from the top end upwardly), the connection units 12 are arranged on the top wall 13 of the unit body 11 side by side. Each of the connection units 12 is formed into a profile engageable with a connector 6. On the other hand, the connector 6 is connected to respective terminals of electric wires (voltage detecting wires) 7 extending from unit cell batteries (not illustrated) of e.g. an in-vehicle power supply unit. Then, the connector 6 is led out and fitted to one of the connection units 12. Owing to the fitting of the connector 6 to one of the connection units 12, voltage of the unit cell batteries is inputted to the electronic component housing unit 3 where the voltage control of the power supply unit is executed.

The top cover 5 is adapted so as to cover the electronic component housing unit 3 and has a rectangular outer profile capable of covering the whole electronic component housing unit 3, as illustrated in FIGS. 1 and 2. The top cover 5 is in the form of a rectangular box including a top wall part 23 and a peripheral sidewall part 24. Opposed to the top wall 13 of the electronic component housing unit 3, the top wall part 23 covers the top wall 13. Opposed to the sidewalls 14 of four peripheral faces of the electronic component housing unit 3, the peripheral sidewall part 24 covers the sidewalls 14. The lower end of the top cover 5 is opened to define a bottom opening portion 25. The electronic component housing unit 3 is inserted into the top cover 5 through the bottom opening portion 25. Consequently, the top cover 5 covers the electronic component housing unit 3 from the upper side in the vehicular vertical direction. The top cover 5 is adapted so as to have a tightly closed structure preventing air entering the inside from leaking out through the top wall part 23 and the sidewall part 24.

Figure 5:
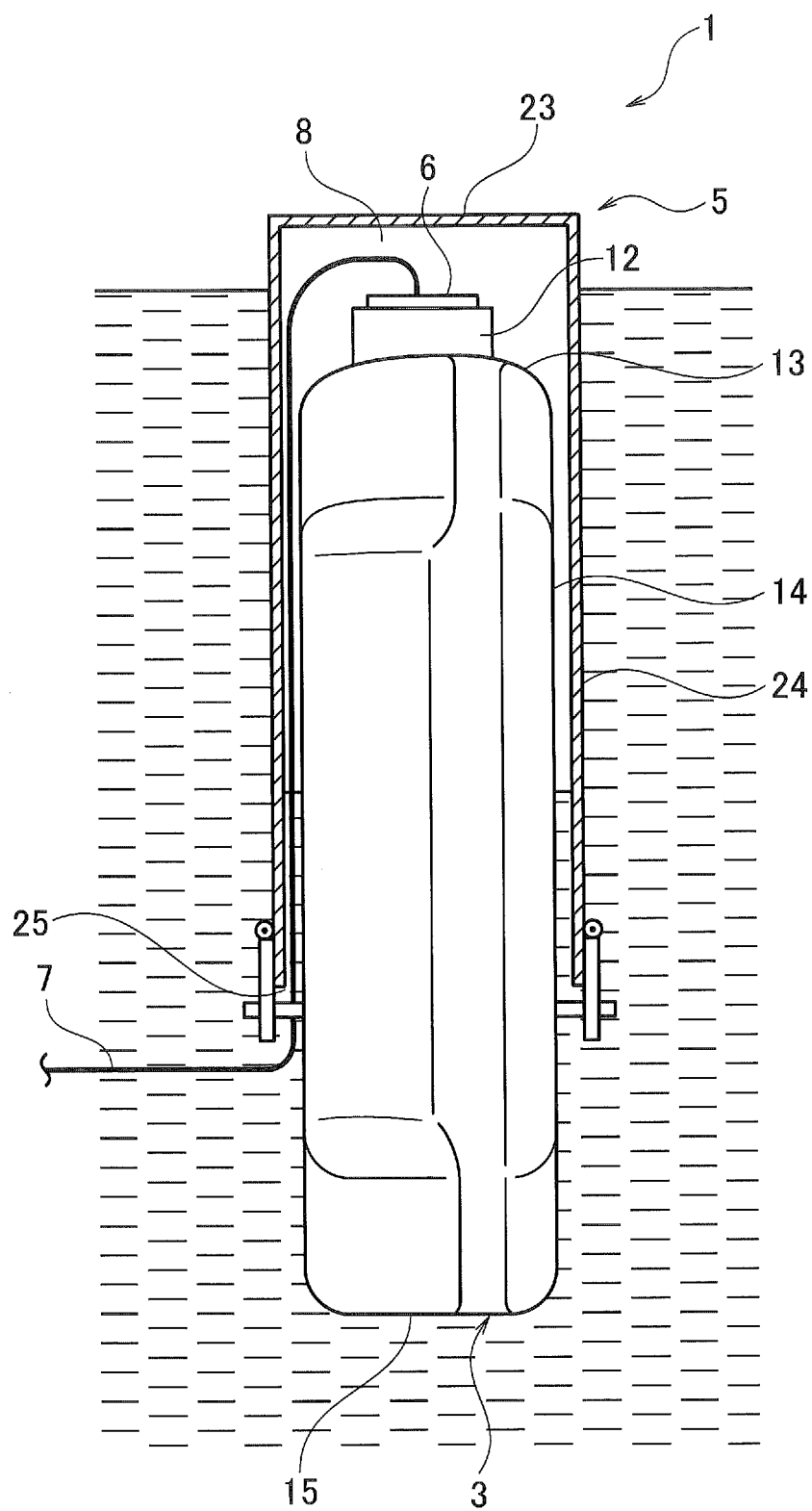
FIG. 5 is a sectional view illustrating the action of the waterproof structure according to the first embodiment.

Under the condition that the top cover 5 covers the electronic component housing unit 3, there is defined a space (room) 8 between the connector 6 fitted to one of the connection units 12 on the top wall 13 of the electronic component housing unit 3 and the top wall part 23 of the top cover 5 (see FIG. 5). The formation of the space 8 can be accomplished by providing locking members 30 for locking the top cover 5 to the electronic component housing unit 3 and further selecting the positions of the locking members 30 along the vehicular vertical direction. The positions of the locking members 30 are determined so that the bottom opening portion 25 of the top cover 5 is arranged on the bottom side in comparison with the connector 6 fitted to one of the connection units 12, in the vehicular vertical direction.

As illustrated in FIGS. 1 and 2, each locking member 30 includes a locking pins 31 arranged in appropriate positions on the sidewalls 14 of the electronic component housing unit 3 in the vehicular vertical direction, and locking pieces 32 arranged on the peripheral sidewall part 24 of the top cover 5 to be locked to the locking pins 31. As long as one can lock the top cover 5 to the electronic component housing unit 3 so as to remain the space 8 between the top cover 5 and the electronic component housing unit 3, additionally, the locking member 30 is not limited to this structure and therefore, it may be composed of hooks, bolts and nuts, engagement between locking projections and locking claws, or other members.

Since the top cover 5 is locked to the electronic component housing unit 3 by the locking members 30, the top cover 5 does not float off even when an ambient water level rises so that the electronic component housing unit 3 goes under the water and therefore, it is possible to maintain a state where the top cover 5 covers the electronic component housing unit 3, certainly.

Note that, in a case that the other member, such as a battery case, is disposed above the top cover 5, there may be adopted either one structure where the other member holds down the top cover 5 or another structure where the top cover 5 is elastically held down by a spring or the like between the other member and the top cover 5, so that the top cover 5 covers the electronic component housing unit 3. Even in this case, it is possible to prevent the top cover 5 from floating off even when an ambient water level rises so that the electronic component housing unit 3 goes under the water and therefore, it is possible to maintain the state where the top cover 5 covers the electronic component housing unit 3.

Under the condition that the top cover 5 covers the electronic component housing unit 3, the wires 7 connected to the connector 6 are routed, inside the top cover 5, from the connector 6 along the vertical direction of the electronic component housing unit 3. Then, the wires 7 are led out from the bottom opening portion 25 of the top cover 5, as illustrated in FIGS. 1, 2, and 5.

In the waterproof structure 1 according to the first embodiment, even when a vehicle goes under the water due to the heavy rains, floods, or the like, and consequently, the ambient water level rises so that the electronic component housing unit 3 goes under the water, air inside the top cover 5 is compressively confined in the space 8 between the connector 6 on the top wall 13 of the electronic component housing unit 3 and the top wall part 23 of the top cover 5. As the air pressure in the space 8 prevents the water level from rising in the space between the top cover 5 and the electronic component housing unit, there is no possibility that the water reaches the connector units 12 or the connector 6 on the top wall 13 of the electronic component housing unit 3. Therefore, there is no possibility that the connector 6 and the connection units 12 are submerged. That is, there is no need of providing the fitting portion between the connector 6 and the connection units 12 with a waterproof structure.

The top cover 5 includes the top wall part 23 for covering the top wall 13 on the top side of the electronic component housing unit 3 in the vehicular vertical direction, and the peripheral sidewall part 24 for covering the sidewalls 14 of the electronic component housing unit 3. Consequently, there is provided a sealed structure capable of preventing air from leaking out, so that there is no possibility that air leaks out through the space 8 between the connection units 12 of the electronic component housing unit 3 and the top cover 5.

The top cover 5 includes the locking members 30 locked to the electronic component housing unit 3 under condition that the cover 5 covers the electronic component housing unit 3. For this reason, there is defined the space 8 between the connection units 12 of the electronic component housing unit 3 and the top wall part 23 of the top cover 5, so that it is possible to prevent the water level from rising due to air pressure in the space 8, certainly. Additionally, since the locking members 30 prevent the top cover 5 from floating off, it is possible to maintain the space 8 certainly even if an ambient water level rises so that the electronic component housing unit 3 goes under the water.

Second Embodiment

Figure 6:
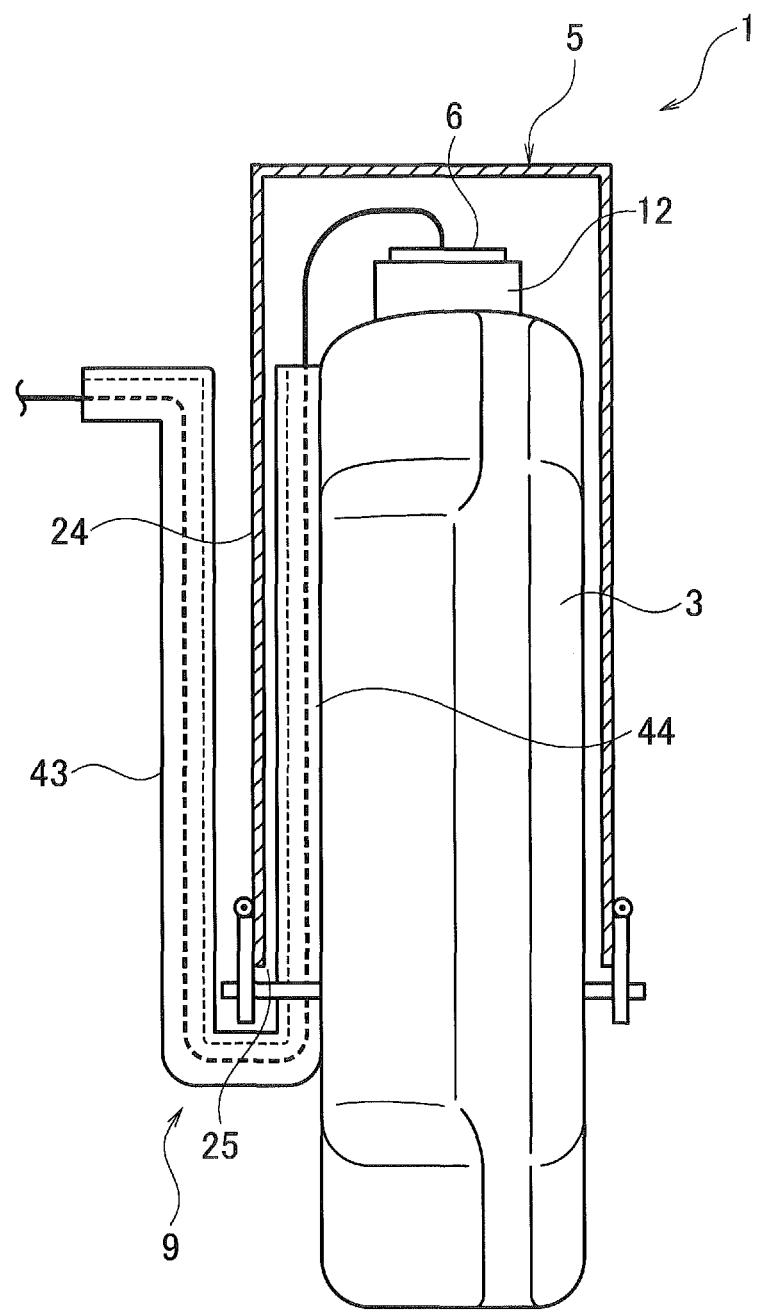
FIG. 6 is a general longitudinal sectional view illustrating a waterproof structure according to a second embodiment.
Figure 7:
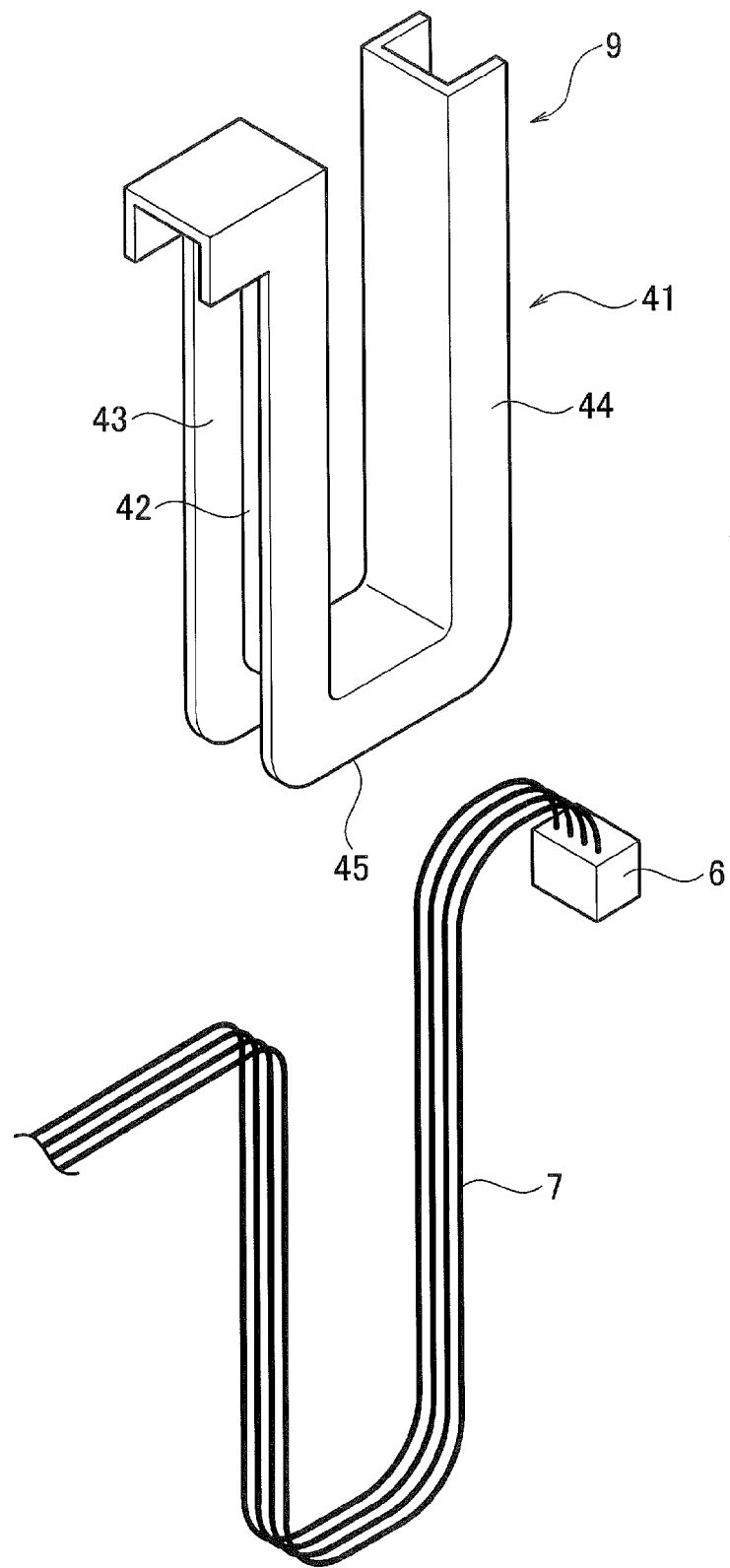
FIG. 7 is a perspective view illustrating the routing of wires into a wire guide member in the waterproof structure according to the second embodiment.

FIGS. 6 to 7 illustrate a waterproof structure 1 according to a second embodiment.

In the waterproof structure 1 according to the second embodiment, as illustrated in FIG. 6, the top cover 5 is provided with a wire guide member 9. The wire guide member 9 includes a guide body 41 bent in a U-shaped manner and a wire accommodating groove 42 formed in the guide body 41, as illustrated in FIGS. 7 and 8.

The guide body 41 includes two left and right guide parts 43, 44 extending in the vehicular vertical direction and a connecting part 45 which connects the two guide parts 43, 44 with each other, on the bottom side in the vehicular vertical direction. As illustrated in FIG. 6, since the guide body 41 is inserted, from the bottom side in the vehicular vertical direction, into the top cover 5 so that the two guide parts 43, 44 straddle the peripheral sidewall part 24, the wire guide member 9 is arranged in relation to the top cover 5.

The wire accommodating groove 42 is formed over the whole length of the guide body 41 since the same groove is formed from the left and right guide parts 44, 44 to the connecting part 45. The wire accommodating groove 42 serves to guide the wires 7 since they are led out from the connector 6 and then inserted into the wire accommodating groove 42. That is, with the arrangement where the guide parts 43, 44 extend along the vehicular vertical direction while the guide part 44 on one hand is inserted into the top cover 5, the wires 7 led out from the connector 6 are guided to the bottom opening portion 25 of the top cover 5. On the other hand, the other guide part 43 guides the wires 7 led out from the bottom opening portion 25 of the top cover 5 to the top side in the vehicular vertical direction.

Figure 8:
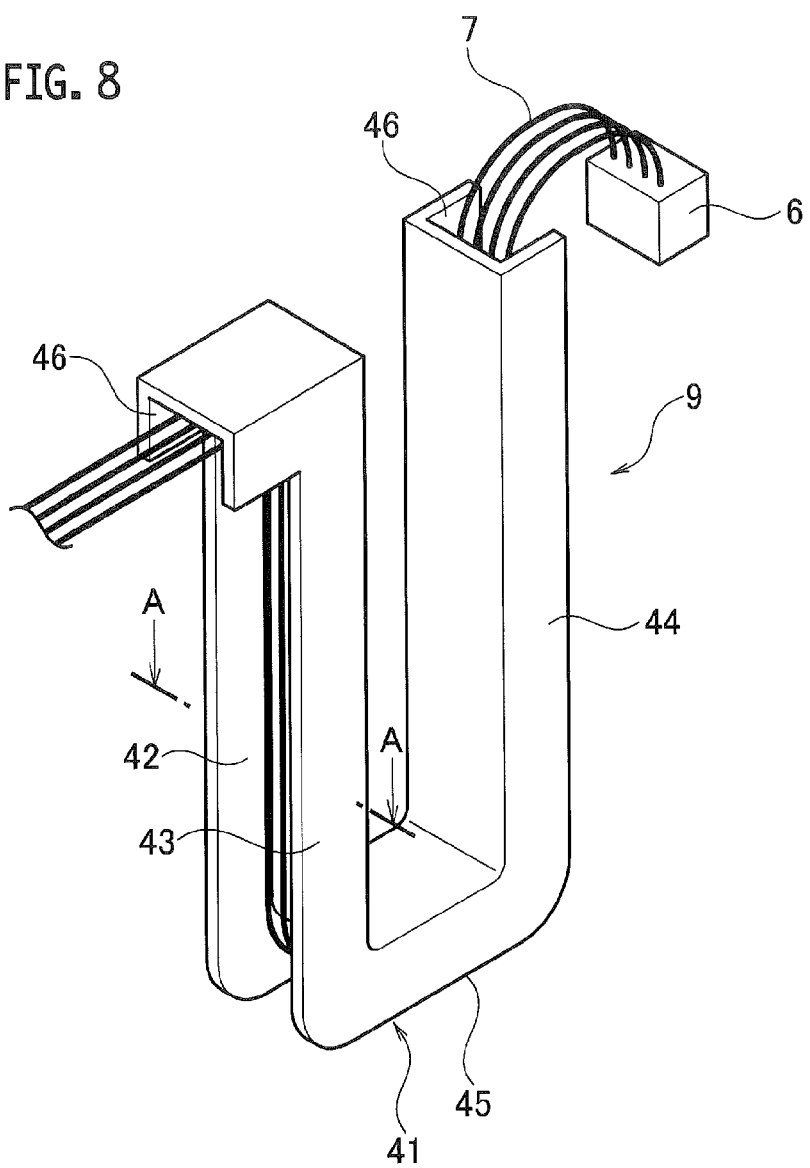
FIG. 8 is a perspective view illustrating the attachment of the wires to the wire guide member in the waterproof structure according to the second embodiment.
Figure 9:
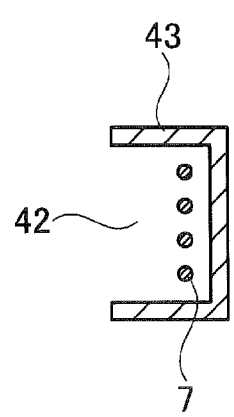
FIG. 9 is a sectional view taken along a line A-A of FIG. 8.

FIGS. 7 and 8 illustrate the procedure of routing the wires 7 in the wire guide member 9. First, as illustrated in FIG. 7, it is carried out to arrange the wires 7 connected to the connector 6 close to the guide body 41 from the bottom side in the vehicular vertical direction and further insert them into the wire accommodating groove 42. Then, with the arrangement where hooks 46 are attached to respective upper ends of the left and right guide parts 43, 44, the wires 7 are routed along the wire guide member 9, as illustrated in FIG. 8. FIG. 9 is a sectional view taken along a line A-A of FIG. 8, illustrating a situation where the wires 7 are kept being inserted into the wire accommodating groove 42.

As the wire guide member 9 reliably guides the wires 7 led out from the connector 6 to the bottom opening portion 25 of the top cover 5 in the second embodiment, the routing of the wires 7 against the top cover 5 can be stabilized. Additionally, as the occurrence of a situation where the wires 7 are going to get damaged by their contact with the top cover 5 can be prevented, it is possible to prevent an occurrence of disconnection or short circuit derived from vibrations during vehicle travelling.

Although the wire accommodating groove is assembled as an individual member in the second embodiment, it may be formed integrally with the top cover 5 or the electronic component housing unit 3 in advance.

Third Embodiment

Figure 10:
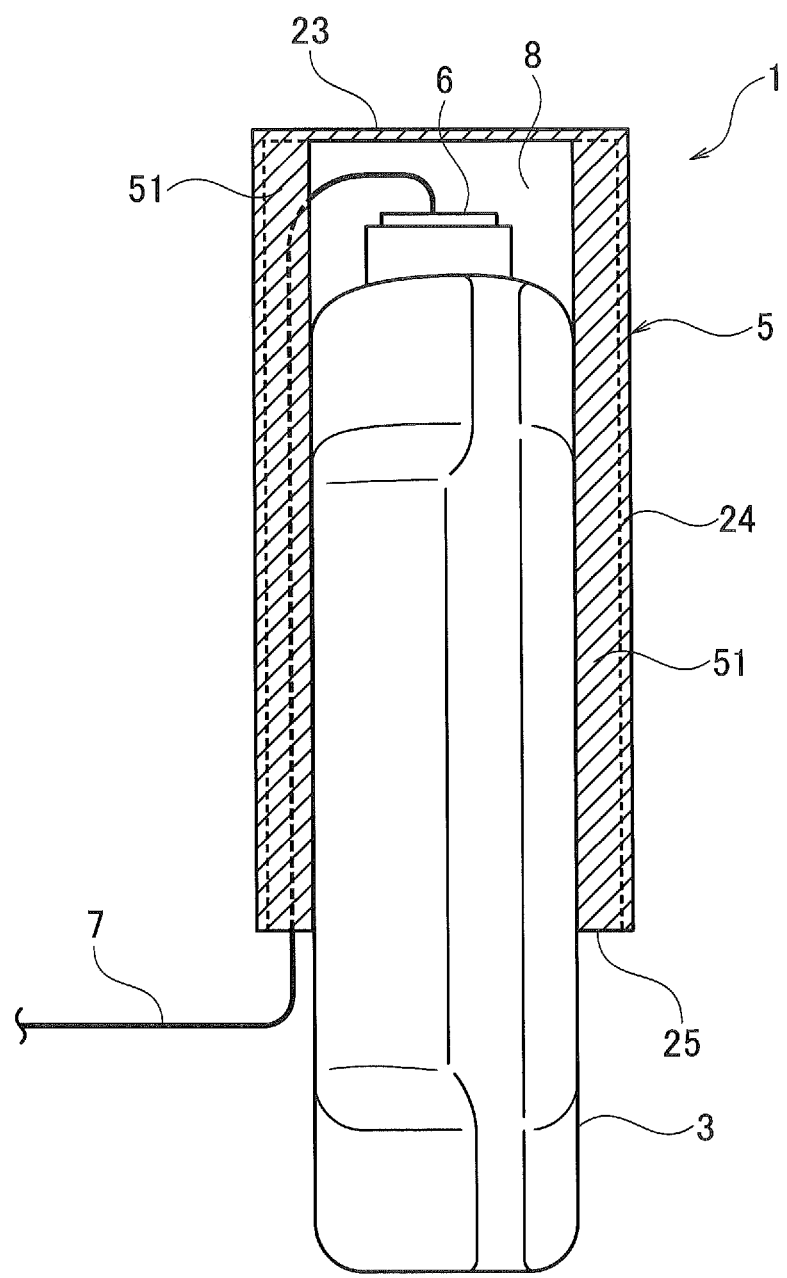
FIG. 10 is a general longitudinal sectional view illustrating a waterproof structure according to a third embodiment.
Figure 11:
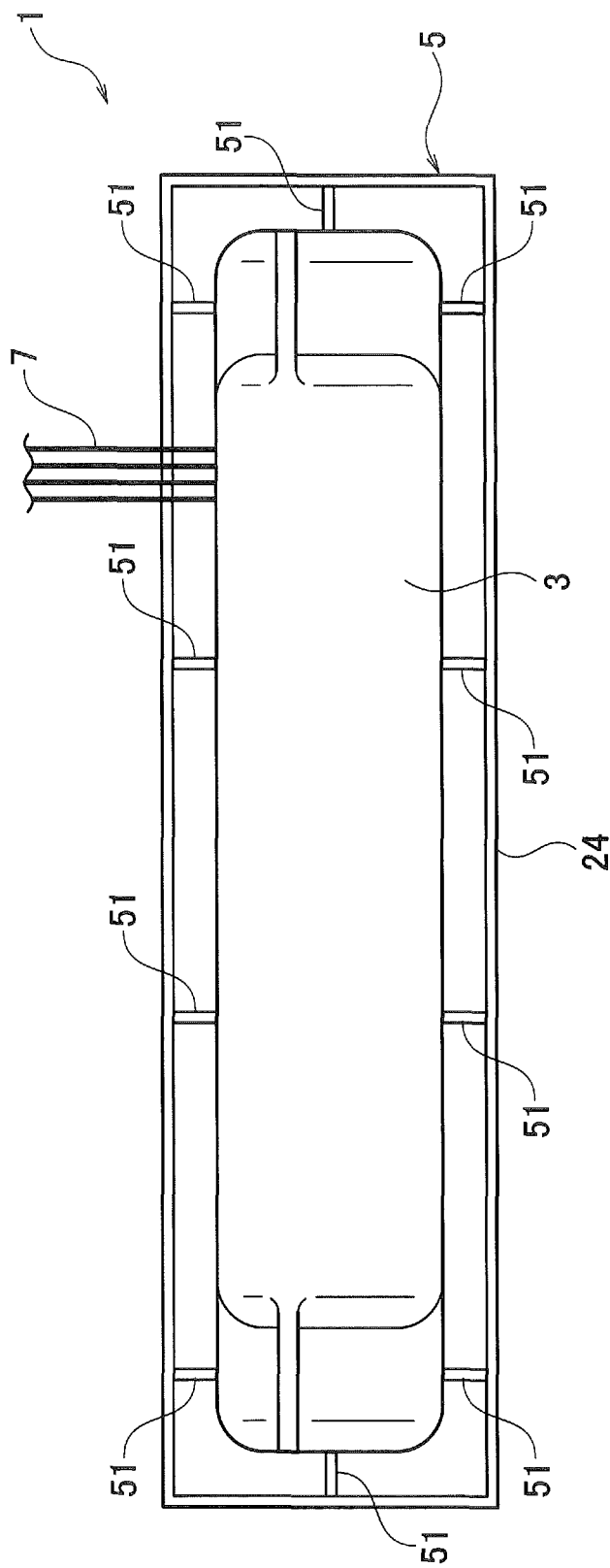
FIG. 11 is a cross sectional view illustrating the waterproof structure according to the third embodiment.

FIGS. 10 and 11 illustrate a waterproof structure 1 according to a third embodiment. In the third embodiment, the top cover 5 is provided with ribs 51. As illustrated in FIG. 11, the ribs 51 are provided in the top cover 5.

The respective ribs 51 project from an inner wall of the peripheral sidewall part 24 of the top cover 5 toward the electronic component housing unit 3. Again, the respective ribs 51 extend from the top wall part 23 of the top cover 5 in the vehicular vertical direction and reach the bottom opening portion 25 of the top cover 5.

Owing to the provision of the ribs 51 in the top cover 5, the surface waving of water entering the inside of the top cover 5 is reduced. As a result, it is possible to prevent the connection units 12 on the top wall 13 of the electronic component housing unit 3 and the connector 6 fitted to one of the connection units 12 from being submerged. Additionally, as the plurality of ribs 51 surrounds the circumference of the electronic component housing unit 3, it is possible to stabilize the top cover 5 being attached to the electronic component housing unit 3 and also possible to ensure sufficient space between the electronic component housing unit 3 and the top cover 5, whereby the amount of air in the top cover 5 can be increased and consequently, it is possible to prevent the surface of water from rising between the electronic component housing unit 3 and the top cover 5.

Fourth Embodiment

Figure 12:
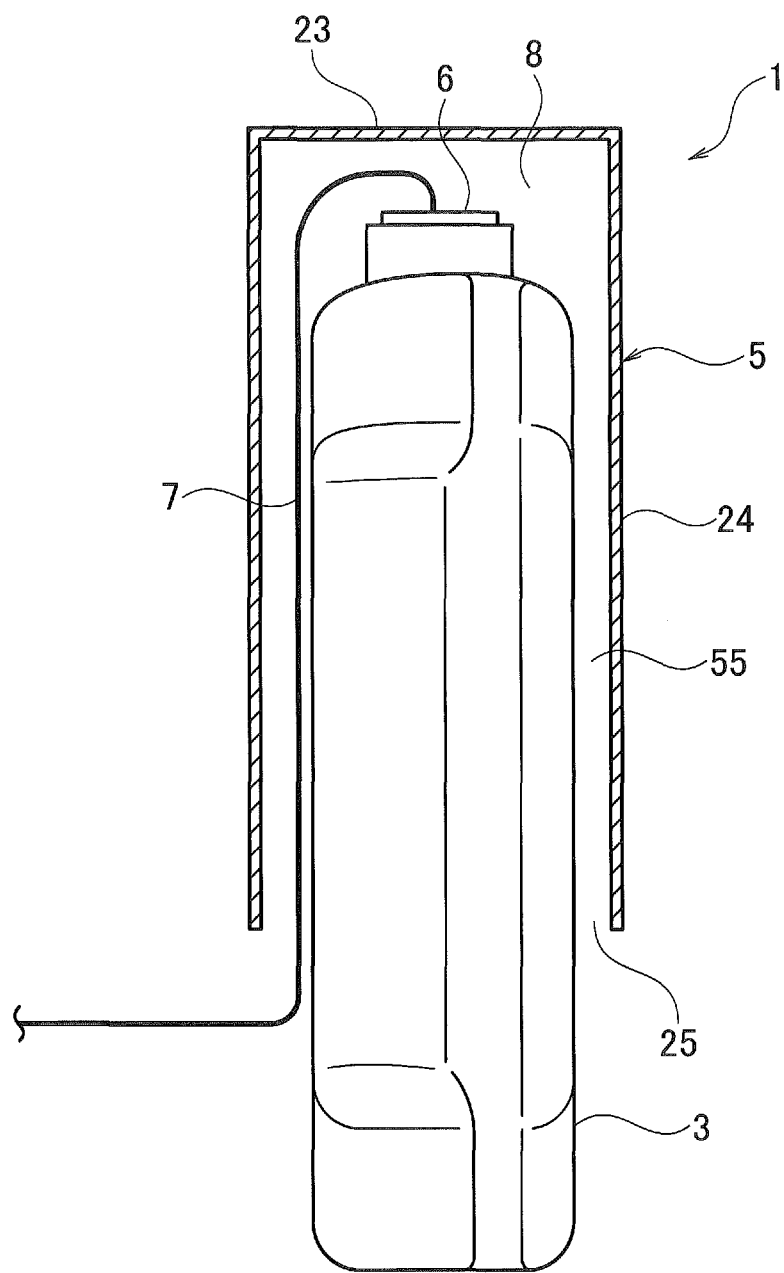
FIG. 12 is a longitudinal sectional view illustrating a waterproof structure according to a fourth embodiment.

FIG. 12 illustrates a waterproof structure 1 according to a fourth embodiment. In the fourth embodiment, the ribs 51 of the third embodiment are not adopted but a space 55 is defined between the top cover 5 and the electronic component housing unit 3. The space 55 can be easily provided by increasing the dimension of the peripheral sidewall part 24 of the top cover 5 in comparison with the electronic component housing unit 3.

Owing to the provision of the space 55, the air volume in the top cover 5 gets increased to allow the amount of air in the top cover 5 to be increased. For this reason, even when the ambient water level rises so that the electronic component housing unit 3 goes under the water and consequently, the water level between the top cover and the electronic component housing unit 3 is elevated higher than the lower end of the top cover 5, the rising of the water surface in the space between the top cover 5 and the electronic component housing unit 3 can be prevented due to the large amount of air, so that it is possible to prevent the water from reaching the top wall 13 of the electronic component housing unit 3. Consequently, it is possible to prevent the connection units 12 on the top wall 13 of the electronic component housing unit 3 and the connector 6 fitted to one of the connection units 12 from being submerged, more certainly.

Although the first to fourth embodiments have been described by the examples of using a connector structure in the connection between the terminals of the wires 7 and the connection units 12, the waterproof structure of the present invention is applicable even to one case where the terminals of the wires 7 are connected to the connection units 12 directly or another case where terminal fitting are connected to the terminals of the wires 7 and subsequently connected to the connection units 12 directly.

Additionally, although the connection units 12 and the connector 6 fitted to one of the connection units 12 are arranged on the top wall 13 of the electronic component housing unit 3, they could be arranged at, not limited to the top wall 13, any places other than the bottom wall of the electronic component housing unit, such as an upside of the sidewall 14, as long as these places would not be submerged.

Fifth Embodiment

Figure 13A:
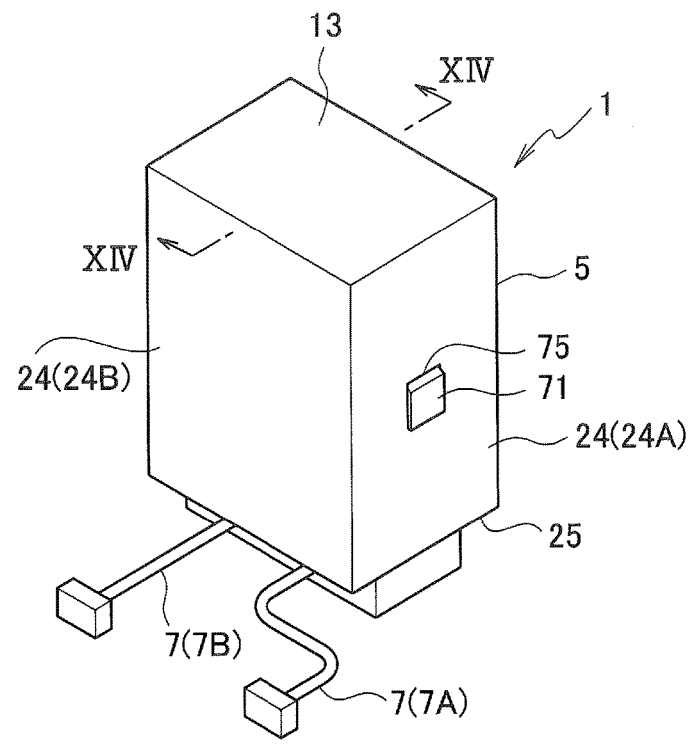
FIG. 13A is a perspective view illustrating a waterproof structure according to a fifth embodiment and FIG. 13B a perspective view illustrating the waterproof structure as a result of removing a top cover from FIG. 13A.
Figure 13B:
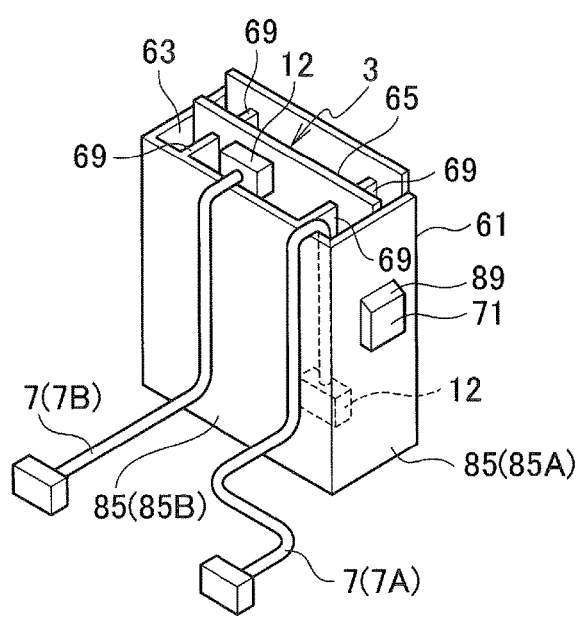
Figure 14:
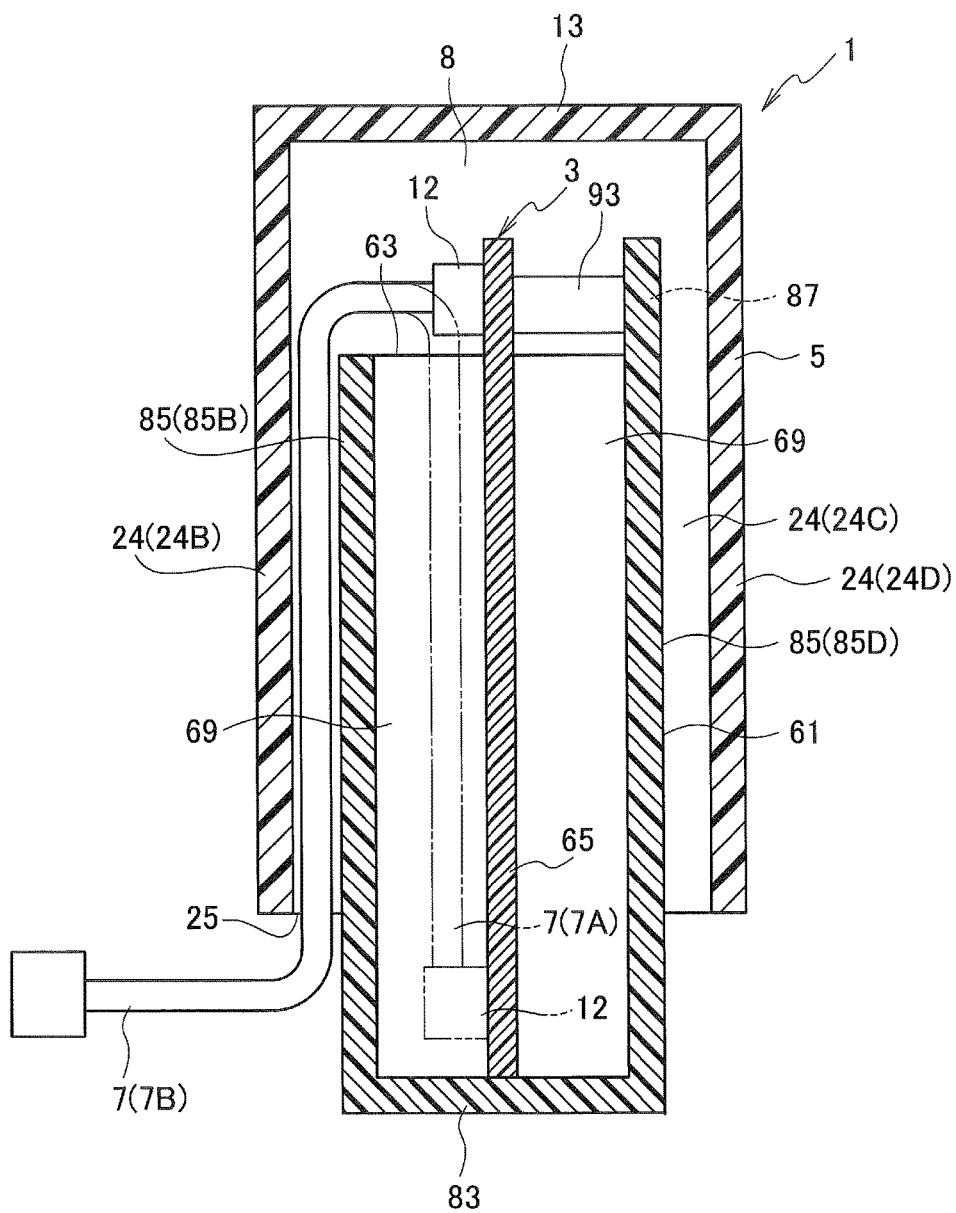
FIG. 14 is a sectional view taken along a line XIV-XIV of FIG. 13A.
Figure 15:
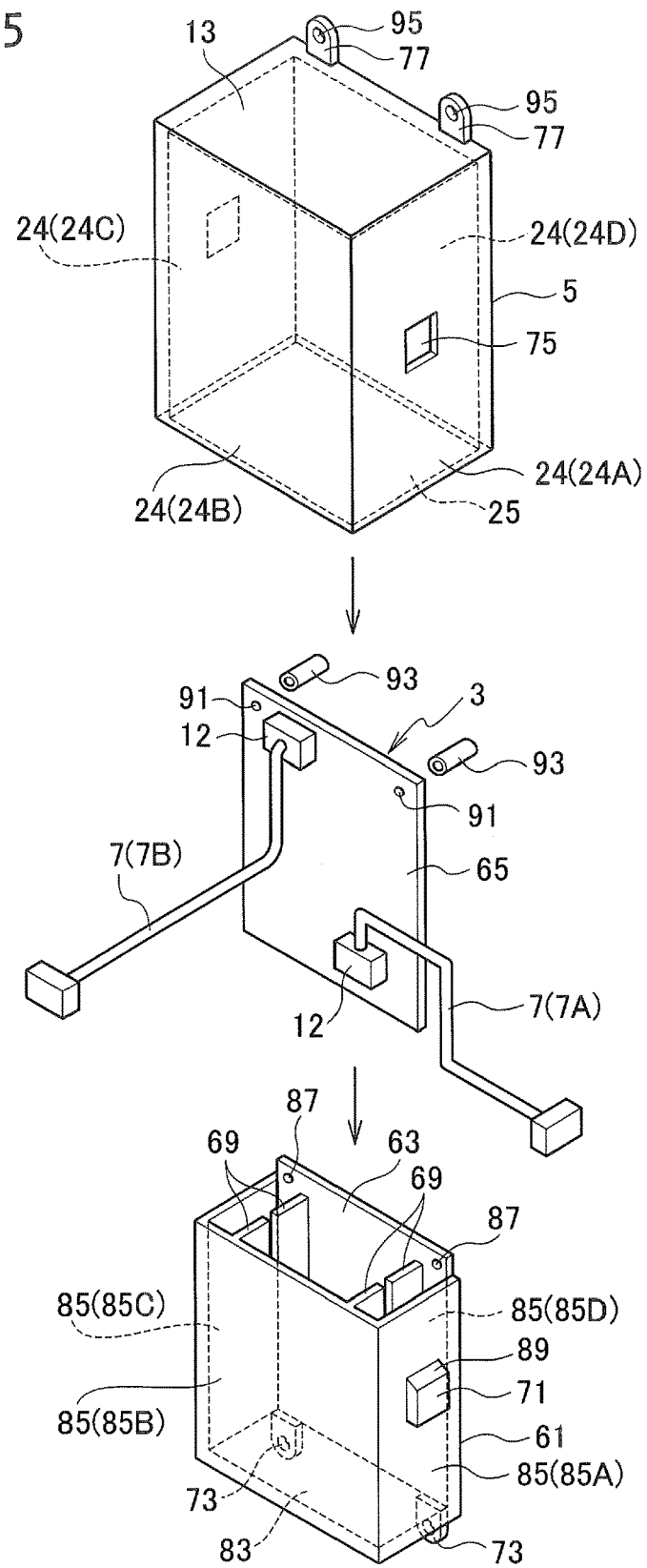
FIG. 15 is an exploded perspective view of the waterproof structure according to the fifth embodiment.

FIGS. 13 to 15 illustrate a waterproof structure 1 according to a fifth embodiment. The waterproof structure 1 according to the fifth embodiment is different from the waterproof structures 1 according to the first to fourth embodiments in the provision of a bottom cover 61, but otherwise the present waterproof structure 1 is constructed substantially similar to the waterproof structures 1 according to the first to fourth embodiments.

In the waterproof structure 1 according to the fifth embodiment, the electronic component housing unit 3 is covered with the bottom cover 61 from below and furthermore, the bottom cover 61 and the electronic component housing unit 3 covered with the bottom cover 61 are covered with the top cover 5.

The waterproof structure 1 according to the fifth embodiment includes the bottom cover (e.g. a bottom cover composed of insulating synthetic resin) 61 and the top cover 5, thereby waterproofing the electronic component housing unit 3.

The electronic component housing unit 3 is provided with the connection units 12 to which the terminals of the wires 7 are connected. A top opening portion 63 is provided at an upper end of the bottom cover 61. In other words, the bottom cover 61 is opened at the upper end to cover the electronic component housing unit 3 from the lower side in the vehicular vertical direction.

The top cover 5 is opened at the lower end and covers the electronic component housing unit 3 and the bottom cover 61 from the upper side in the vehicular vertical direction while defining the space 8 in which the terminals of the wires 7 connected to the connection units 12 of the electronic component housing unit 3 are accommodated.

In a mode where one of the connection units 12 is not arranged at the top end of the electronic component housing unit 3 but is arranged at the intermediate portion or the lower end in the vertical direction, the wire 7 (7A) led out from one of the connection units 12 passes through: between the electronic component housing unit 3 and the bottom cover 61; the top opening portion 63 of the bottom cover 61; and between the top cover 5 and the bottom cover 61 and subsequently, the wire is led out from the bottom opening portion 25 of the top cover 5.

Besides, in a mode where another one of the connection units 12 is arranged at the top end of the electronic component housing unit 3, the wire 7 (7B) led out from another one of the connection units 12 passes through: the top opening portion 63 of the bottom cover 61; and between the top cover 5 and the bottom cover 61 and subsequently, the wire is led out from the bottom opening portion 25 of the top cover 5.

Also, in the waterproof structure 1 according to the fifth embodiment, the electronic component housing unit 3 is composed of an exposed substrate 65 only.

Figure 16:
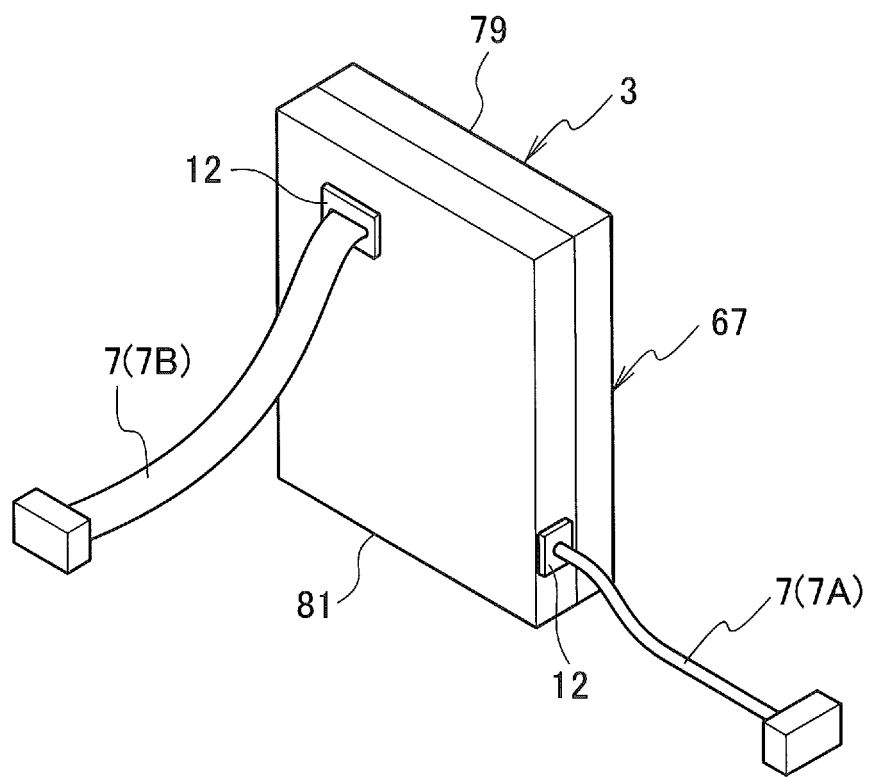
FIG. 16 is a view illustrating a modification of an electronic component housing unit used in the waterproof structure according to the fifth embodiment.

As illustrated in FIG. 16 or as similar to the electronic component housing unit 3 according to the first to fourth embodiments, the electronic component housing unit 3 may be composed of the substrate 65 and a substrate case 67 in which the substrate 65 is accommodated. The substrate case 67 corresponds to the unit body 11 of the first embodiment and is composed of e.g. insulating synthetic resin.

As illustrated in FIG. 16, the substrate case 67 of the electronic component housing unit 3 includes a first case 79 in the form of a rectangular box and a second case 81. The peripheral part of a rectangular opening of the first case 79 and the peripheral part of a rectangular opening of the second case 81 are joined to each other through a sealing material, such as a rectangular packing. Thus, the electronic component housing unit is adapted so that water or the like does not enter the interior of the substrate case 67 through any parts other than the connection units 12.

As illustrated in FIG. 15, the bottom cover 61 is provided with temporary locked parts 71 and vehicular engaging parts 73, while the top cover 5 is provided with temporary locking parts 75 and vehicular engaging parts 77.

Since the temporary locked parts 71 are locked to the temporary locking parts 75, the bottom cover 61 is locked to the top cover 5 temporarily. Additionally, while the bottom cover 61 is locked to the top cover 5 temporarily, the vehicular engaging parts 73 of the bottom cover 61 are engaged with a vehicle body and additionally, the vehicular engaging parts 77 of the top cover 5 are engaged with the vehicle body, so that the bottom cover 61 and the top cover 5 are installed to the vehicle body integrally. Note that to display the vehicular engaging parts 73 and the vehicular engaging parts 77 is eliminated in FIGS. 13 and 14.

The bottom cover 61 is provided with a plurality of ribs 69 which project toward the electronic component housing unit 3 and extend from the bottom side in the vehicular vertical direction up to an opening (top opening portion) 63 at the upper end of the bottom cover 61.

Here, the waterproof structure 1 according to the fifth embodiment will be described in more detail.

The substrate 65 is formed like a rectangular flat plate and also provided, on its one surface in the thickness direction of the substrate 65, with a plurality of (e.g. two) connection units 12. One of the connection units 12 is arranged on the lower side of the substrate 65, while another one of the connection units 12 is arranged at the upper end of the substrate 65. Note that all the connection units 12 may be arranged at the intermediate part or the lower end part of the substrate 65 in the vertical direction. Alternatively, the connection units 12 may be arranged on both surfaces of the substrate 65 in the thickness direction, or there may be provided only one connection unit 12 on the substrate.

The bottom cover 61 is formed like a rectangular box including a bottom wall part 83 in the form of a rectangular flat plate, and four sidewall parts 85 (85A, 85B, 85C, 85D) in the form of rectangular flat plates, which stand from the periphery of the bottom wall part 83 upwardly. In the four sidewall parts 85, one sidewall part 85D has a projection height higher than respective projection heights of the other three sidewall parts 85A, 85B, 85C.

The sidewall part 85D is provided, at its upper end part, with substrate fixing parts (for example, female threaded holes) 87 for fixing the substrate 65.

One pair of sidewall parts 85A, 85C, which are adjacent to the sidewall part 85D and parallel to each other, are provided with temporary locked parts 71, respectively. The temporary locked parts 71 are formed by rectangular parallelepiped small projections projects from outside surfaces of the sidewall parts 85A, 85C, respectively. The temporary locked parts 71 are arranged at central parts in the width direction and also central parts in the vertical direction of the sidewall parts 85A, 85C. Additionally, the temporary locked parts 71 are formed, at their upper ends, with guide surfaces 89 laid out obliquely.

The ribs 69 are formed like rectangular flat plates and provided on the sidewall part 85D and the sidewall part 85B opposed to the sidewall part 85D, and project to the inside of the bottom cover 61. The ribs 69 are provided in a plurality, for example, two for the sidewall part 85B and two for the sidewall part 85D.

The ribs 69, whose thickness direction coincides with the thickness direction of the sidewall parts 85A, 85C, are provided so as to stand from the bottom wall part 83 up to the top opening portion 63 continuously (The ribs are as tall as the sidewall parts 85A, 85B, 85C).

The ribs 69 rise up from the sidewall part 85B in the thickness direction of the sidewall part 85B by a predetermined height and also rise up from the sidewall part 85D in the thickness direction of the sidewall part 85D by a predetermined height. In the thickness direction of the sidewall parts 85A, 85C (i.e. the width direction of the sidewall parts 85B, 85D), the ribs 69 are provided in respective intermediate portions of the sidewall parts 85B, 85D, at predetermined intervals. When viewed from the thickness direction of the sidewall part 85B and the sidewall part 85D, the respective ribs 69 of the sidewall part 85B and the respective ribs 69 of the sidewall part 85D are overlapping each other.

In the thickness direction of the sidewall part 85B or the sidewall part 85D, additionally, the ribs 69 of the sidewall part 85B and the ribs 69 of the sidewall part 85D are spaced apart from each other through an interval nearly equal to the thickness of the substrate 65.

Next, the installation of the substrate 65 into the bottom cover 61 will be described. The substrate 65 is provided, at its top portion, with substrate fixing parts (e.g. through holes) 91 for fixing the substrate 65 to the bottom cover 61.

The substrate 65, whose thickness direction coincides with the thickness direction of the sidewall part 85B or the sidewall part 85D, is inserted into the bottom cover 61 while being sandwiched between the ribs 69 of the sidewall part 85B and the ribs 69 of the sidewall part 85D.

Cylindrical collars 93 are arranged between the substrate 65 inserted into the bottom cover 61 and the sidewall part 85D. Since fastening members (not illustrated), such as bolts, which penetrate through the through holes 91 of the substrate 65 and the collars 93, are screwed into the female thread holes 87 of the sidewall part 85D, the substrate 65 is installed, inside the bottom cover 61, integrally with the bottom cover 61.

The ribs 69 are positioned so as not to interfere with the connection units 12 of the substrate 65 and electronic components mounted on the substrate 65.

In the situation where the substrate 65 is inserted and installed into the bottom cover 61, the wire 7A is extended up to the top opening portion 63 of the bottom cover 61 through a space between the substrate 65 and the sidewall part 85B and further extended, from the top opening portion 63, outside the bottom cover 61.

As similar to the bottom cover 61, the top cover 5 is also formed like a rectangular box including the top wall part 23 in the form of a rectangular flat plate and four peripheral sidewall parts 24 (24A, 24B, 24C, 24D) in the form of rectangular flat plates.

The sidewall parts 24A, 24C in pairs are provided with temporary locking parts 75, respectively. The temporary locking parts 75 are formed by rectangular through holes.

Then, in the state where the top cover 5 is temporarily set to the bottom cover 61 in which the substrate 65 is installed, the bottom cover 61 and the top cover 5 are integrated with each other since the temporary locked parts 71 of the bottom cover 61 enter the temporary locking parts 75 of the top cover 5.

Again, in the state where the top cover 5 is temporarily set to the bottom cover 61 in which the substrate 65 is installed, the upper portion of the bottom cover 61 except for its lower end enters the top cover 5, so that gaps are defined between the sidewall part 85B of the bottom cover 61 and the sidewall part 24B of the top cover 5 and between the sidewall part 85D of the bottom cover 61 and the sidewall part 24D of the top cover 5 and additionally, the space (internal space) 8 is also formed between the top opening portion 63 of the bottom cover 61 and the top wall part 23 of the top cover 5. Note that no space is formed between the sidewall part 85A of the bottom cover 61 and the sidewall part 24A of the top cover 5, so that the sidewall part 85A and the sidewall part 24A come into contact with each other and additionally, no space is formed between the sidewall part 85C of the bottom cover 61 and the sidewall part 24C of the top cover 5, so that the sidewall part 85C and the sidewall part 24C come into contact with each other.

In the state where the top cover 5 is temporarily set to the bottom cover 61 in which the substrate 65 is installed, the wires 7 are extended in the gap between the sidewall part 85B and the sidewall part 24B and further extended to an outside through the bottom opening portion 25 of the top cover 5.

As illustrated in FIG. 15, the vehicular engaging parts 77 on the top cover 5 are formed by a pair of protrusions which protrude from the top wall part 23 of the top cover 5 upwardly and which are provided with through holes 95, respectively. The vehicular engaging parts 73 on the bottom cover 61 are formed by a pair of protrusions which protrude from the bottom wall part 83 of the bottom cover 61 downwardly and which are provided with through holes, respectively.

Then, by screwing the fastening members, such as bolts, into the female threads provided in the vehicle body through the through holes 95 of the vehicular engaging parts 77 and the through holes of the vehicular engaging parts 73, such a temporary assembly where the top cover 5 is temporarily set to the bottom cover 61 having the substrate 65 installed therein is installed to the vehicle body integrally.

Incidentally, although the lower end of the substrate 65 comes into contact with the bottom wall part 83 of the bottom cover 61 in the waterproof structure 1, the lower end of the substrate 65 may be spaced apart from the bottom wall part 83 of the bottom cover 61 upwardly.

Again, it is noted that the space 8 is defined since the top wall part 23 of the top cover 5 is positioned above the top opening portion 63 of the bottom cover 61. In connection, although the bottom opening portion 25 of the top cover 5 is positioned, between the top opening portion 63 of the bottom cover 61 and the bottom wall part 83 of the bottom cover 61 in the vertical direction, close to the bottom wall part 83, the bottom opening portion 25 of the top cover 5 may be located below the bottom wall part 83.

The procedure of forming the waterproof structure according to the fifth embodiment will be described.

First, it is carried out to insert the substrate 65 into the interior of the bottom 61 from upside. At this time, it has allowed for the wires 7 to be extended from the top opening portion 63 of the bottom cover 61.

Subsequently, it is carried out to lay the top cover 5 on the substrate 65 and the bottom cover 61 from the upside and successively insert the substrate 65 and the bottom cover 61 into the top cover 5, thereby setting the top cover 5 to the bottom cover 61 temporarily. At this time, it has allowed for the wires 7 to be extended from the bottom opening portion 25 of the top cover 5.

Subsequently, the top cover 5 and the bottom cover 61 are installed to the vehicle body.

According to the waterproof structure 1 according to the fifth embodiment, the electronic component housing unit 3 is covered with the bottom cover 61 from the lower side in the vehicular vertical direction, while the electronic component housing unit 3 and the lower covering 61 is covered with the top cover 5 from the upper side in the vehicular vertical direction with the space 8. Additionally, the wires 7 led out from one of the connection units 12 pass through: between the electronic component housing unit 3 and the bottom cover 61; the top opening portion 63 of the bottom cover 61; and between the top cover 5 and the bottom cover 61 and subsequently, the wires are led out from the bottom opening portion 25 of the top cover 5. Accordingly, the same effect as the waterproof structures 1 according to the first to fourth embodiments is performed in the fifth embodiment.

Additionally, according to the waterproof structure 1 according to the fifth embodiment, owing to the provision of the bottom cover 61 in addition to the top cover 5, even if the connection units 12 having the terminals of the wires 7 connected thereto are located on parts (e.g. the intermediate part or the lower part in the vertical direction) other than the upper end of the electronic component housing unit 3, water would never enter the connection units 12 for the wires 7 in the situation where the bottom cover 61 containing the electronic component housing unit 3 and the top cover 5 are submerged, so that there is no possibility that the terminals of the wires 7 and the connection units 12 are submerged.

Further, according to the waterproof structure 1 according to the fifth embodiment, as the connection units 12 having the terminals of the wires 7 connected thereto can be located on parts other than the upper end of the electronic component housing unit 3, the degree of freedom in designing the substrate 65 of the electronic component housing unit 3 is enhanced.

Still further, according to the waterproof structure 1 according to the fifth embodiment, as the top cover 5 and the bottom cover 61 are composed of synthetic resin, it is possible to mold the top cover 5 and the bottom cover 61 at low cost.

Further, according to the waterproof structure 1 according to the fifth embodiment, as the electronic component housing unit 3 is composed of only the substrate 65, the electronic component housing unit 3 becomes reduced in size. Correspondingly, it is possible to miniaturize the top cover 5 and the bottom cover 61 and also possible to make the installation space for the electronic component housing unit 3 smaller.

Still further, according to the waterproof structure 1 according to the fifth embodiment, owing to the provision of the bottom cover 61, the waterproofing of the substrate 65 is accomplished even without a substrate case.

Meanwhile, if the electronic component housing unit 3 is constructed so as to accommodate the substrate 65 in the substrate case 67, then electronic components on the substrate 65 are covered with the substrate case 67. Therefore, as the electronic components are protected when installing the electronic component housing unit 3 inside the top cover 5 and the bottom cover 61, the installation work of the electronic component housing unit 3 to the top cover 5 and the bottom cover 61 can be facilitated.

Further, according to the waterproof structure 1 according to the fifth embodiment, as it is constructed so that the bottom cover 61 is temporarily locked to the top cover 5 since the temporary locked parts 71 of the bottom cover 61 are locked to the temporary locking parts 75 of the top cover 5 and also constructed so that the bottom cover 61 having the electronic component housing unit 3 installed therein and the top cover 5 are installed in the vehicle under such a temporarily locked condition. For this reason, the installation of the bottom cover 61 having the electronic component housing unit 3 installed therein and the top cover 5 in the vehicle can be facilitated.

Still further, according to the waterproof structure 1 according to the fifth embodiment, owing to the provision of the plurality of ribs 69 in the bottom cover 61, the rigidity of the bottom cover 61 can be enhanced to allow the substrate 65 to be retained firmly and simultaneously, the wires 7 can be guided by using the ribs 69, so that the routing of the wires 7 can be facilitated.

Note that the waterproof structure 1 according to the fifth embodiment may be modified in the same way as the second to fourth embodiments illustrated in FIGS. 6 to 12. Then, the guide section 44 illustrated in FIG. 6 and the ribs 51 illustrated in FIG. 10 will be brought into contact with the bottom cover 61.

Further, it is desirable that when viewing the ribs 51 of the top cover 5 and the ribs 69 of the bottom cover 61 from the thickness direction of the respective sidewall parts 24B, 24D, 85B, 85D, respective lower portions of the ribs 51 and respective upper portions of the ribs 69 are overlapping each other.

What is claimed is:
1. A waterproof structure, comprising:
an electronic component housing unit capable of being mounted on a vehicle, the electronic component housing unit provided, on a top side of the electronic component housing unit in a vehicular vertical direction, with a connection unit to which a terminal of an electric wire is connected;
a top cover provided with a bottom opening portion opening at a lower end of the top cover and adapted so as to accommodate the electronic component housing unit from an upper side in the vehicular vertical direction while forming a space between the top side of the electronic component housing unit in the vehicular vertical direction and the top cover, in which the terminal of the electric wire connected to the connection unit is housed, wherein
gaps are defined between outer sides of sidewall portions of the electronic component housing unit and inner sides of sidewall portions of the top cover without contact of faces of the outer sides of the sidewall portions of the electronic component housing unit and the inner sides of the sidewall portions of the top cover, and
the electric wire led out from the terminal connected to the connection unit is led out from the bottom opening portion of the top cover via at least one of the gaps.
2. The waterproof structure of claim 1, wherein
the top cover comprises:
a top wall part opposed to a top wall of the electronic component housing unit on the top side in the vehicular vertical direction to cover the top wall;
a peripheral sidewall part opposed to respective sidewalls of the electronic component housing unit to cover the sidewalls;
the bottom opening portion into which the electronic component housing unit is inserted; and
a locking member locked to the electronic component housing unit while the top cover is covering the electronic component housing unit.
3. The waterproof structure of claim 1, further comprising
a wire guide member disposed between the electronic component housing unit and the top cover to guide the electric wire, which has been led out from the terminal connected to the connection unit, to the bottom opening portion of the top cover.
4. The waterproof structure of claim 1, wherein
the top cover is provided with a plurality of ribs which project toward the electronic component housing unit and also extend from the top side in the vehicular vertical direction up to the bottom opening portion.
5. A waterproof structure, comprising:
an electronic component housing unit capable of being mounted on a vehicle, the electronic component housing unit provided with a connection unit to which a terminal of an electric wire is connected;
a bottom cover provided with a top opening portion opening at an upper end of the bottom cover and adapted so as to cover the electronic component housing unit from a lower side in the vehicular vertical direction; and
a top cover provided with a bottom opening portion opening at a lower end of the top cover and adapted so as to accommodate the electronic component housing unit accommodated in the bottom cover from an upper side in the vehicular vertical direction while forming a space in which the terminal of the electric wire connected to the connection unit of the electronic component housing unit is housed, wherein
gaps are defined between outer sides of sidewall portions of the electronic component housing unit and inner sides of sidewall portions of the top cover without contact of faces of the outer sides of the sidewall portions of the electronic component housing unit and the inner sides of the sidewall portions of the top cover, and the electric wire led out from the terminal connected to the connection unit passes through between the electronic component housing unit and the bottom cover and at least one of the gaps between the top cover and the bottom cover, and is led out from the bottom opening portion of the top cover.

6. The waterproof structure of claim 5, wherein the electronic component housing unit is composed of a substrate or composed of a combination of a substrate and a substrate case in which the substrate is housed.

7. The waterproof structure of claim 5, wherein the bottom cover is provided with a plurality of ribs which project toward the electronic component housing unit and also extend from a bottom side thereof in the vehicular vertical direction up to the top opening portion.

8. The waterproof structure of claim 5, further comprising a wire guide member disposed: at least one of: between the electronic component housing unit and the top cover; and between the top cover and the bottom cover, in order to guide the electric wire, which has been led out from the terminal connected to the connection unit, to the bottom opening portion of the top cover.

9. The waterproof structure of claim 5, wherein the top cover is provided with a plurality of ribs which project toward the electronic component housing unit and also extend from the top side in the vehicular vertical direction up to the bottom opening portion.

* * * * *